(12) United States Patent
Jeon

(10) Patent No.: US 7,438,581 B1
(45) Date of Patent: Oct. 21, 2008

(54) SOCKET HAVING PRINTED CIRCUIT BOARD BODY PORTION

(76) Inventor: Myoungsoo Jeon, 39422 Zacate Ave., Fremont, CA (US) 94539

( * ) Notice: Subject to any disclaimer, the term of this patent is extended or adjusted under 35 U.S.C. 154(b) by 0 days.

(21) Appl. No.: 11/433,099

(22) Filed: May 12, 2006

Related U.S. Application Data

(60) Provisional application No. 60/681,675, filed on May 16, 2005.

(51) Int. Cl.
*H01R 4/50* (2006.01)
(52) U.S. Cl. .................. 439/342; 439/101; 439/947
(58) Field of Classification Search ............... 439/101, 439/108, 342, 947
See application file for complete search history.

(56) References Cited

U.S. PATENT DOCUMENTS

| | | | | |
|---|---|---|---|---|
| 3,971,610 A | * | 7/1976 | Buchoff et al. ............. | 439/75 |
| 6,178,629 B1 | * | 1/2001 | Rathburn .................. | 29/843 |
| 6,752,635 B1 | * | 6/2004 | Searls et al. .............. | 439/71 |
| 6,881,073 B2 | * | 4/2005 | Bali et al. ................. | 439/70 |
| 6,986,682 B1 | * | 1/2006 | Jeon ......................... | 439/608 |
| 7,121,874 B1 | * | 10/2006 | Jeon ......................... | 439/495 |
| 7,121,889 B1 | * | 10/2006 | Jeon ......................... | 439/608 |
| 7,150,652 B1 | * | 12/2006 | Jeon ......................... | 439/608 |
| 2004/0253846 A1 | * | 12/2004 | Brown et al. ............... | 439/66 |
| 2006/0154496 A1 | * | 7/2006 | Imamura et al. ............ | 439/66 |

* cited by examiner

*Primary Examiner*—James Harvey
(74) *Attorney, Agent, or Firm*—Imperium Patent Works LLP; T. Lester Wallace; Zheng Jin

(57) ABSTRACT

A high speed socket includes an insulative housing and a printed circuit board body portion. The PCB body portion includes a PCB and surface mount contacts. Each surface mount contact has a first end portion for making contact with an integrated circuit held in the socket and a second end portion for surface mounting to a printed circuit board. The socket's printed circuit board includes AC grounded conductive columns (ACGCC) that extend from a first planar surface of the PCB to a second planar surface of the PCB. The printed circuit board also includes signal conductors. The signal conductors are shielded by the ACGCCs. In one aspect, the socket includes capacitors that are surface mounted to the socket's PCB. In another aspect, the surface mount contacts include self-adjusting solder tails that accommodate PCB warpage.

20 Claims, 19 Drawing Sheets

Layer1: Solder mask
Layer2: Ground plane
Layer3: Dielectric
Layer4: Power plane
Layer5: Dielectric + Ground Planes
Layer6: Power plane
Layer7: Dielectric
Layer8: Ground plane
Layer9: Solder mask

→ HIGH SPEED SIGNAL

┅┅▶ RETURN PATH (GROUND)

BEFORE REFLOW SOLDERING

AFTER REFLOW SOLDERING

SOCKET HAVING PRINTED CIRCUIT BOARD BODY PORTION

CROSS REFERENCE TO RELATED APPLICATION

This application claims the benefit under 35 U.S.C. §119 of provisional application Ser. No. 60/681,675, entitled "HIGH SPEED SOCKET", filed May 16, 2005. The subject matter of provisional application Ser. No. 60/681,675 is incorporated herein by reference.

SUMMARY INFORMATION

In one aspect, a high speed socket includes an insulative housing and a printed circuit board body portion. The PCB body portion includes a PCB and surface mount contacts. Each surface mount contact has a first end portion for making contact with an integrated circuit held in the socket and a second end portion for surface mounting to a printed circuit board. The socket's printed circuit board includes a matrix of AC grounded conductive columns (ACGCC). Each ACGCC extends from a first planar surface of the PCB to a second planar surface of the PCB. The printed circuit board also includes signal conductors. Each signal conductor is shielded by a plurality of surrounding ACGCCs. In another aspect, the socket includes capacitors that are surface mounted to the socket's PCB. In another aspect, the surface mount contacts include self-adjusting solder tails that adjust during reflow soldering to accommodate PCB warpage.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
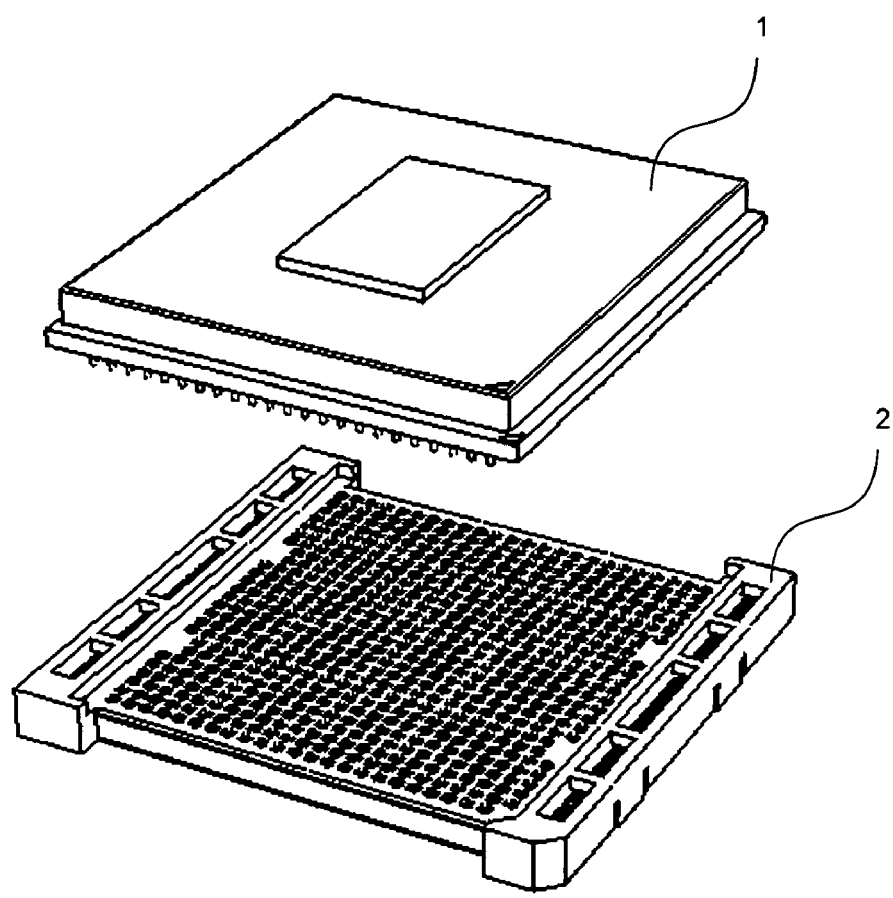
FIG. 1 is a perspective view of a non-ZIF (non zero insertion force) pin grid array (PGA) socket in accordance with a first novel aspect.

FIG. 1 is a perspective view of a non-ZIF (non zero insertion force) pin grid array (PGA) socket in accordance with a first novel aspect. The pins of a PGA integrated circuit package 1 fit down into the socket 2.

Figure 2:
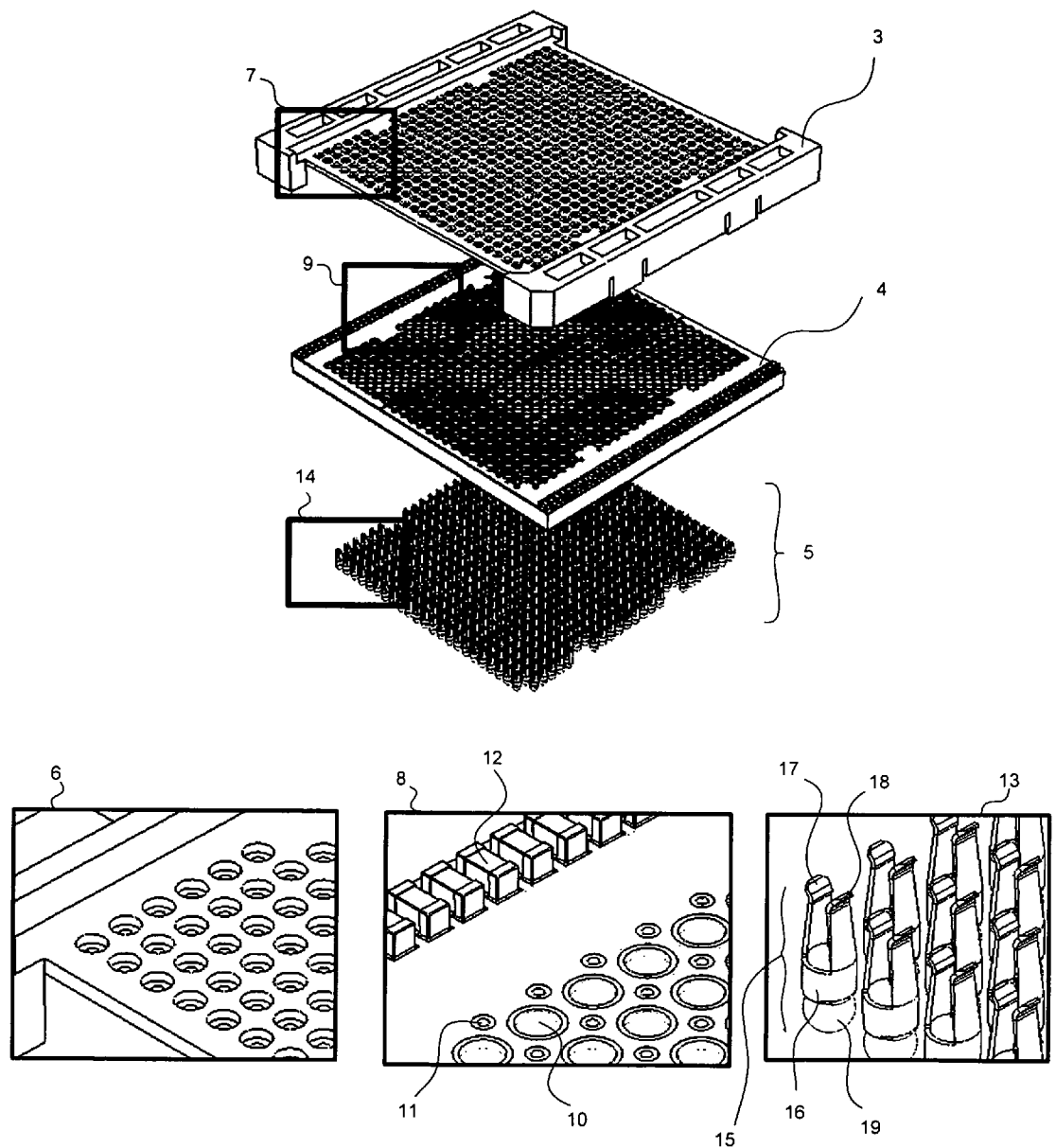
FIG. 2 is an exploded perspective view of the socket of FIG. 1.

FIG. 2 is an exploded perspective view of socket 2 of FIG. 1. The socket 2 includes an insulative housing portion 3, a printed circuit board (PCB) socket body portion 4, and an array of socket contacts 5. Box 6 is an expanded view of box 7 of insulative housing portion 3. A two-dimensional array of guide holes extends vertically through the insulative housing portion 3. Box 8 is an expanded view of box 9 of socket body portion 4. A two-dimensional array of larger diameter plated through holes 10 is provided. As seen in box 8, four smaller diameter plated through holes 11 are disposed around each larger diameter through hole. A row of surface mount decoupling capacitors 12 is soldered to socket body portion 4. The plates of the decoupling capacitors are coupled to ground and power planes within socket body 4. Box 13 is an expanded view of box 14 of socket contact portion 5. Socket contact 15 includes a cylindrically-shaped conductive portion 16, and a pair of contact beams 17 and 18. A solder ball 19 is soldered to the bottom of cylindrical portion 16.

Figure 3:
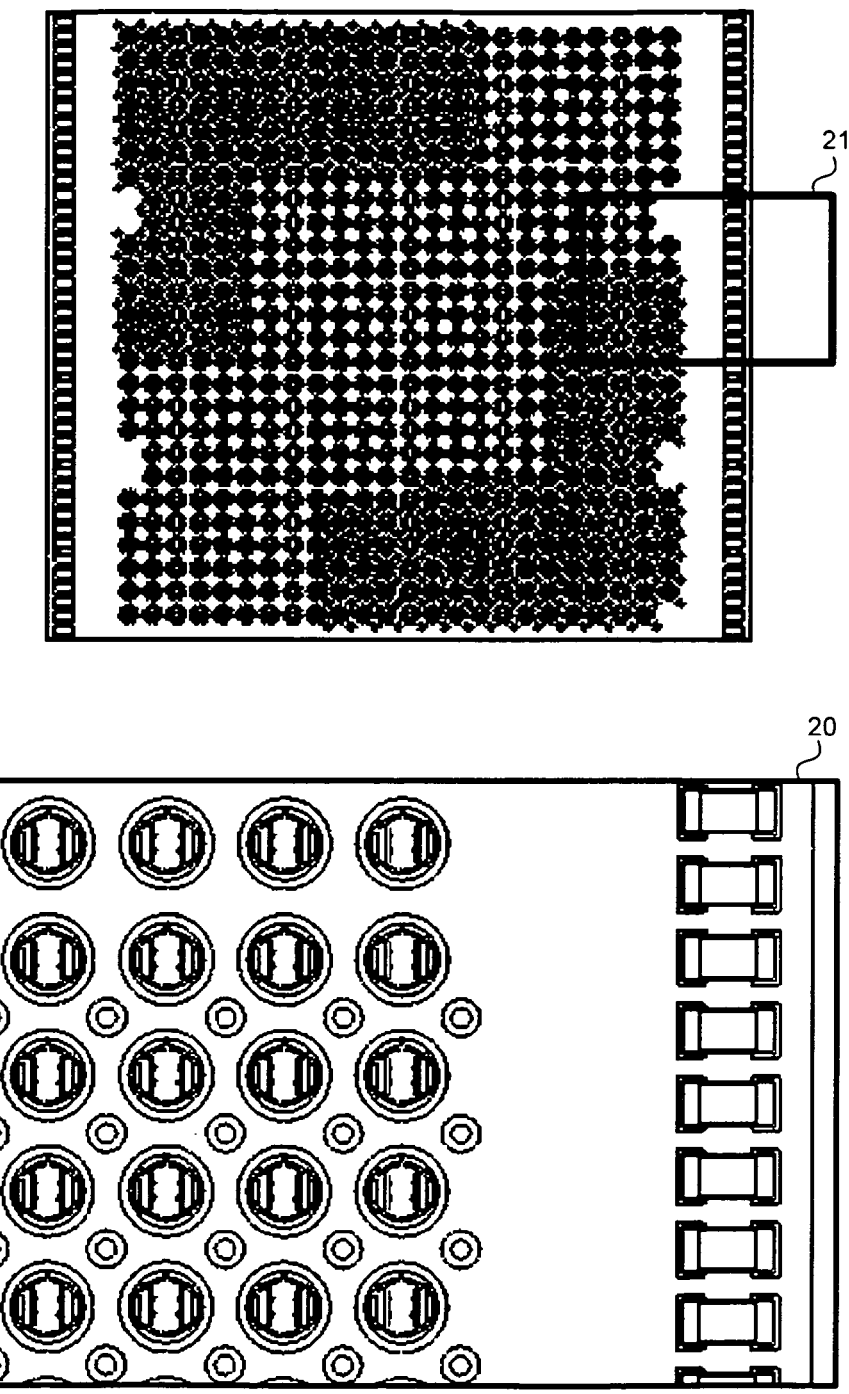
FIG. 3 is a top-down view of socket contacts in the socket body portion of the socket of FIG. 1.

FIG. 3 is a top-down view of socket contacts 5 in place in socket body portion 4. Box 20 is an expanded view of box 21 of the socket body/socket contact assembly.

Figure 4A:
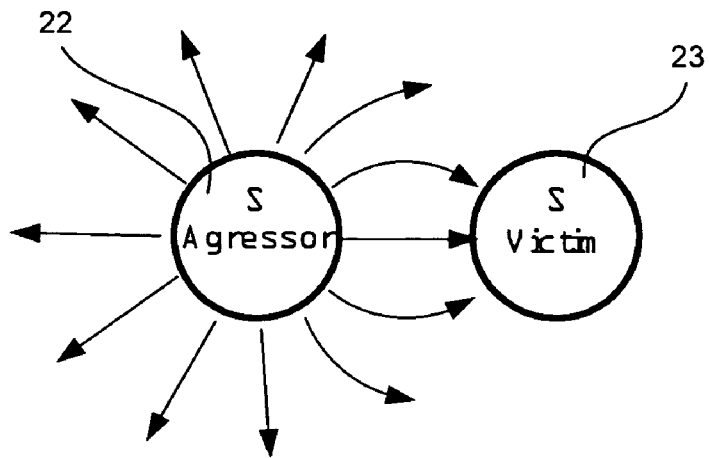
FIG. 4A illustrates a pair of conductors in a conventional socket.

FIG. 4A illustrates a pair of conductors in a conventional socket. An aggressor signal present in the left conductor 22 induces small current in the right victim conductor 23. This small current in the victim conductor 23 represents unwanted cross-talk.

Figure 4B:
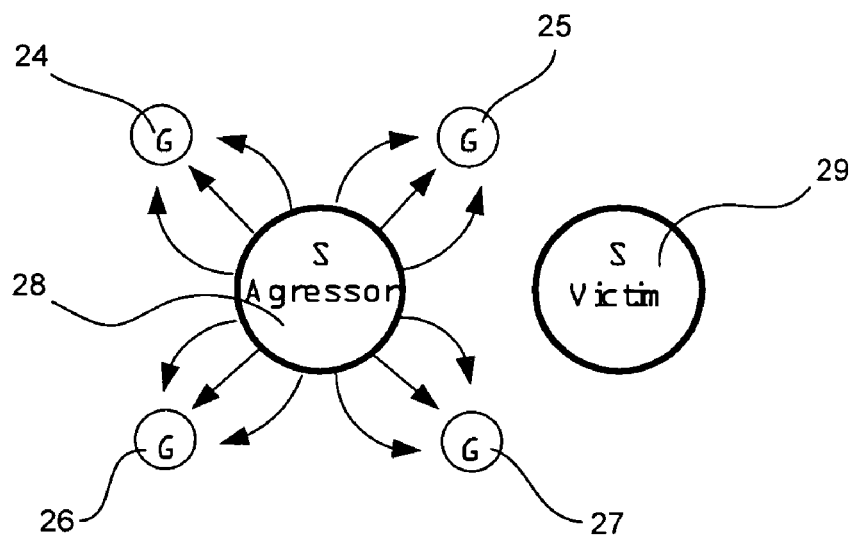
FIG. 4B illustrates a pair of signal conductors in the novel socket. The signal conductor on the left is shielded by four surrounding AC grounded conductive columns (ACGCC) that extend parallel to the signal conductor.

FIG. 4B illustrates a pair of signal conductors in the novel socket and four AC grounded conductive columns 24-27 (in the present example, the AC grounded conductive columns 24-27 are smaller diameter plated through holes). The arrows represent field lines. The presence of the four plated through holes 24-27 terminate field lines originating from the signal conductor 28 and help to prevent the aggressor signal in the left signal conductor 28 from inducing small currents (cross talk) in the right signal conductor 29.

Figure 5:
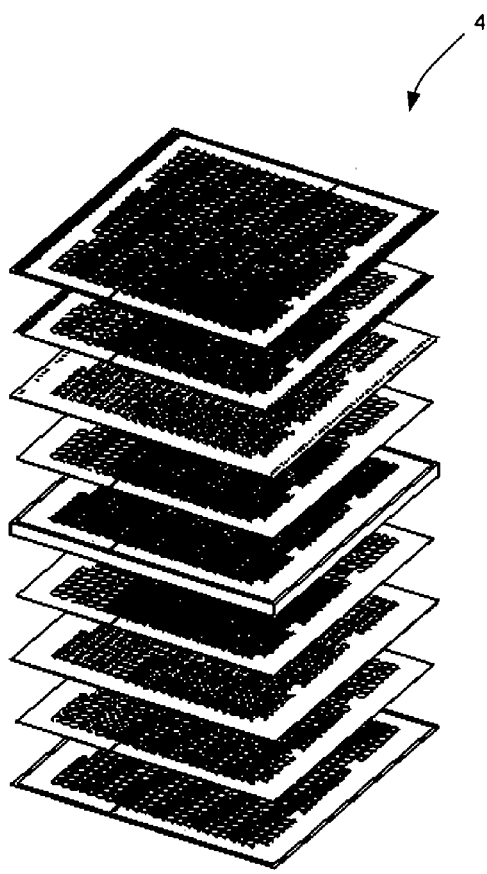
FIG. 5 is an exploded view of various layers making up one embodiment of the PCB socket body portion of the socket of FIG. 1.

FIG. 5 is an exploded view of various layers making up one embodiment of the PCB socket body portion 4.

Figure 6:
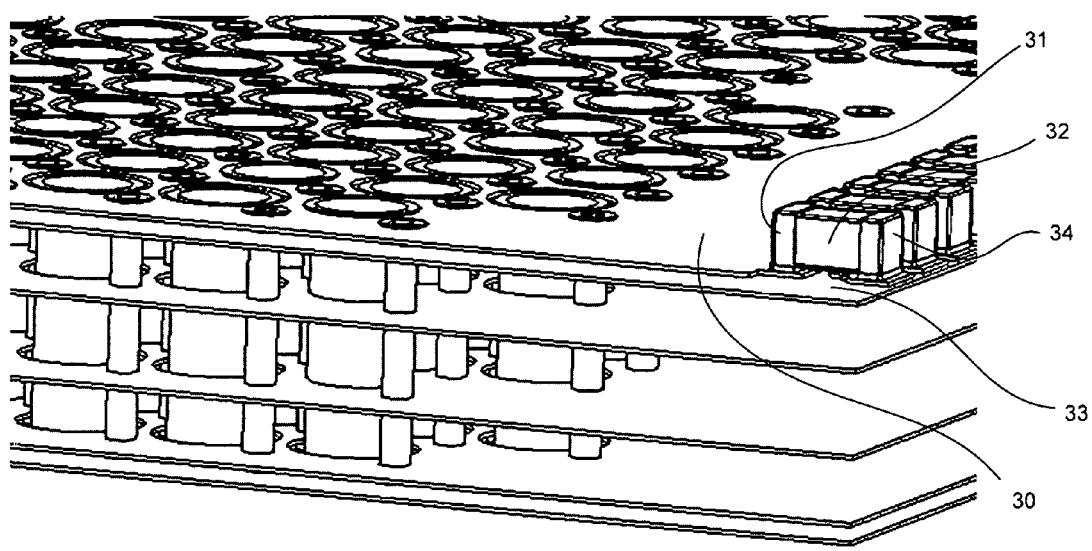
FIG. 6 is an expanded perspective view of the socket body assembly of the socket of FIG. 1.

FIG. 6 is an expanded perspective view of socket body assembly 4. The dielectric material of the socket body is not shown so that the plated through hole conductors can be seen. Ground plane 30 is coupled to plate 31 of capacitor 32. Power plane 33 is coupled to plate 34 of capacitor 32.

Figure 7A:
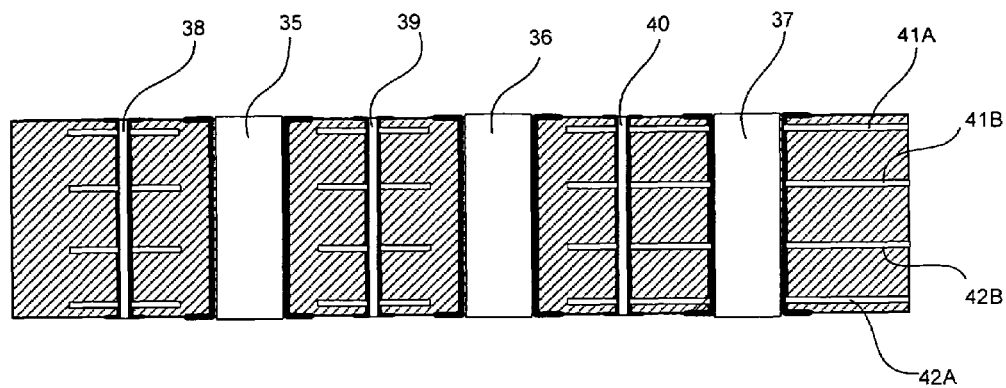
FIG. 7A is a sectional side view of the larger diameter plated through holes.

FIG. 7A is a sectional side view of the larger diameter plated through holes. The two left larger diameter through holes 35 and 36 are used to conduct signals between integrated circuit package 1 (not shown) and an underlying printed circuit board (not shown). The right larger diameter through hole 37 is used for grounding (return path) and couples a pin (not shown) on the integrated circuit package 1 to a ground conductor or ground plate of the underlying printed circuit board (not shown). The smaller diameter plated through holes 38-40 are connected by ground planes 41A, 41B and 42A, 42B to the larger diameter plated through hole 37 used for grounding.

Figure 7B:
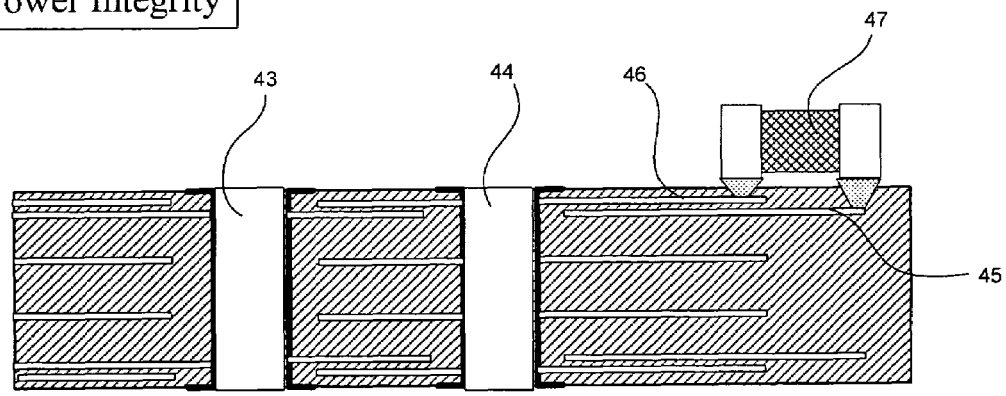
FIG. 7B is a sectional side view of another portion of the socket body assembly. The plate through holes are for conducting power and ground potentials.

FIG. 7B is a sectional side view of another portion of the socket body assembly. The larger diameter power and ground plated through holes 43 and 44 are coupled to power and ground planes 45 and 46, respectively. Surface mount discrete bypass capacitor 47 is soldered to the power and ground planes.

Figure 8:
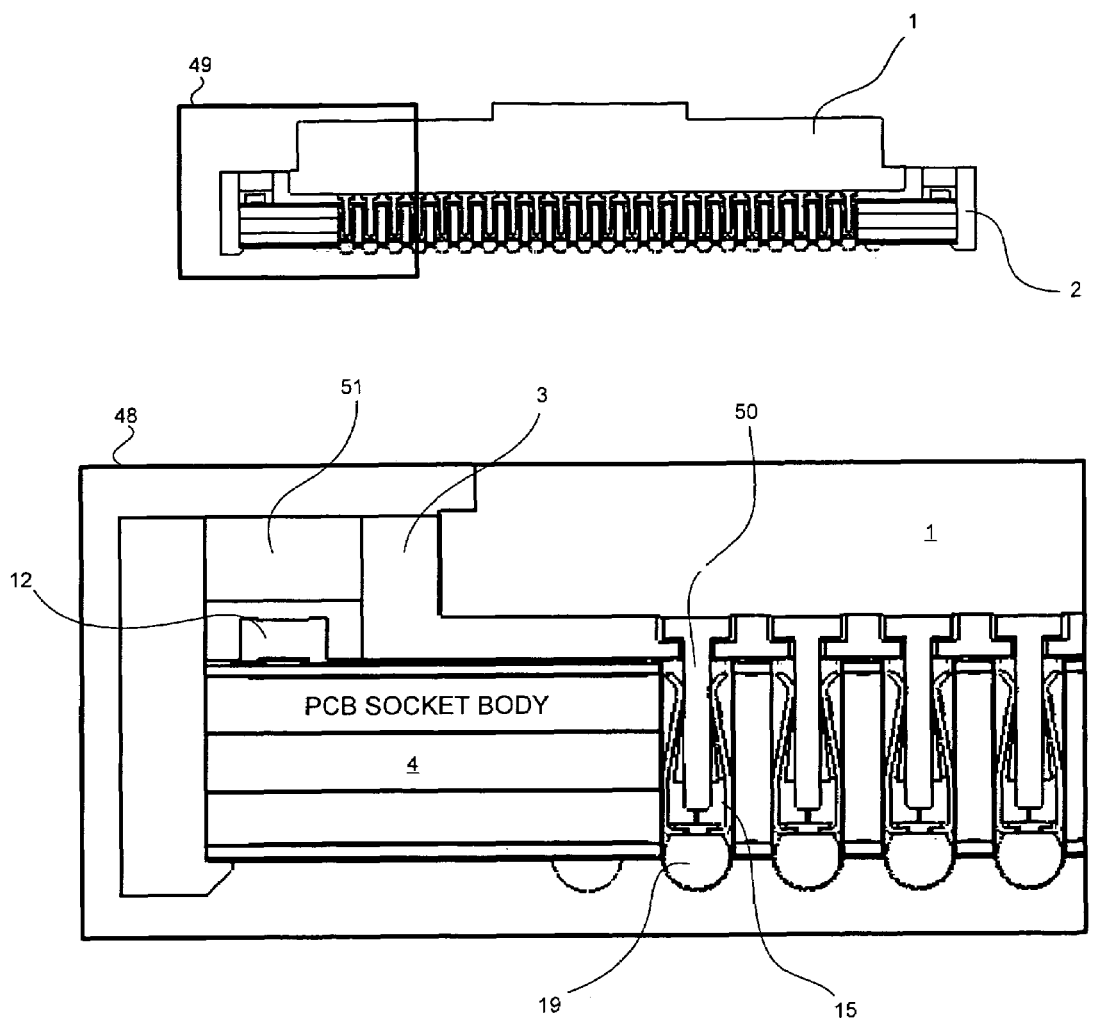
FIG. 8 is a cross-sectional view of a PGA package when it is inserted into the socket of FIG. 1.

FIG. 8 is a cross-sectional view of the PGA package 1 when it is inserted into socket 2. Box 48 is an expanded view of box 49. A pin 50 of IC package 1 is shown inserted into socket contact 15. A vertically-oriented hole 51 is provided in insulative housing portion 3 to allow heat from capacitor 12 to escape upward.

Figure 9:
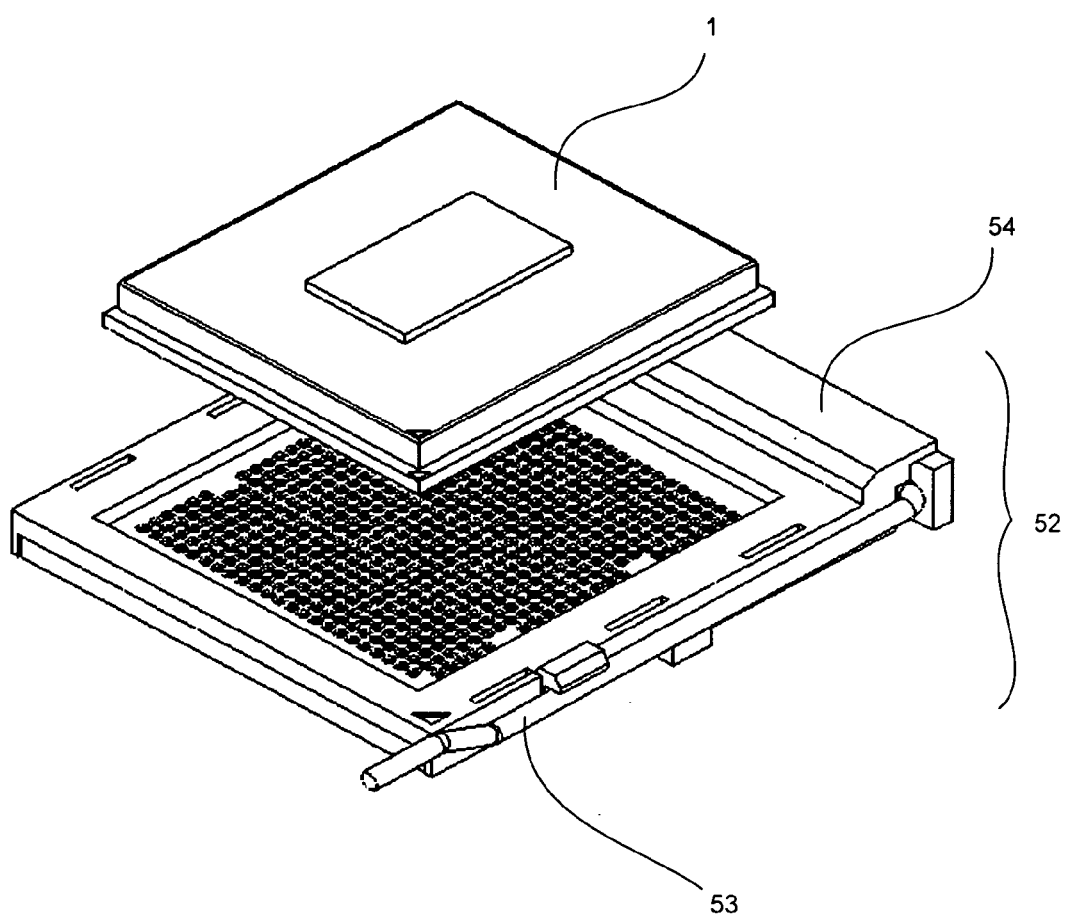
FIG. 9 is a perspective view of a ZIF (zero insertion force) pin grid array (PGA) socket in accordance with a second novel aspect.

FIG. 9 is a perspective view of a ZIF (zero insertion force) pin grid array (PGA) socket 52 in accordance with a second novel aspect. The socket 52 includes a lever 53 and an insulative housing portion 54.

Figure 10:
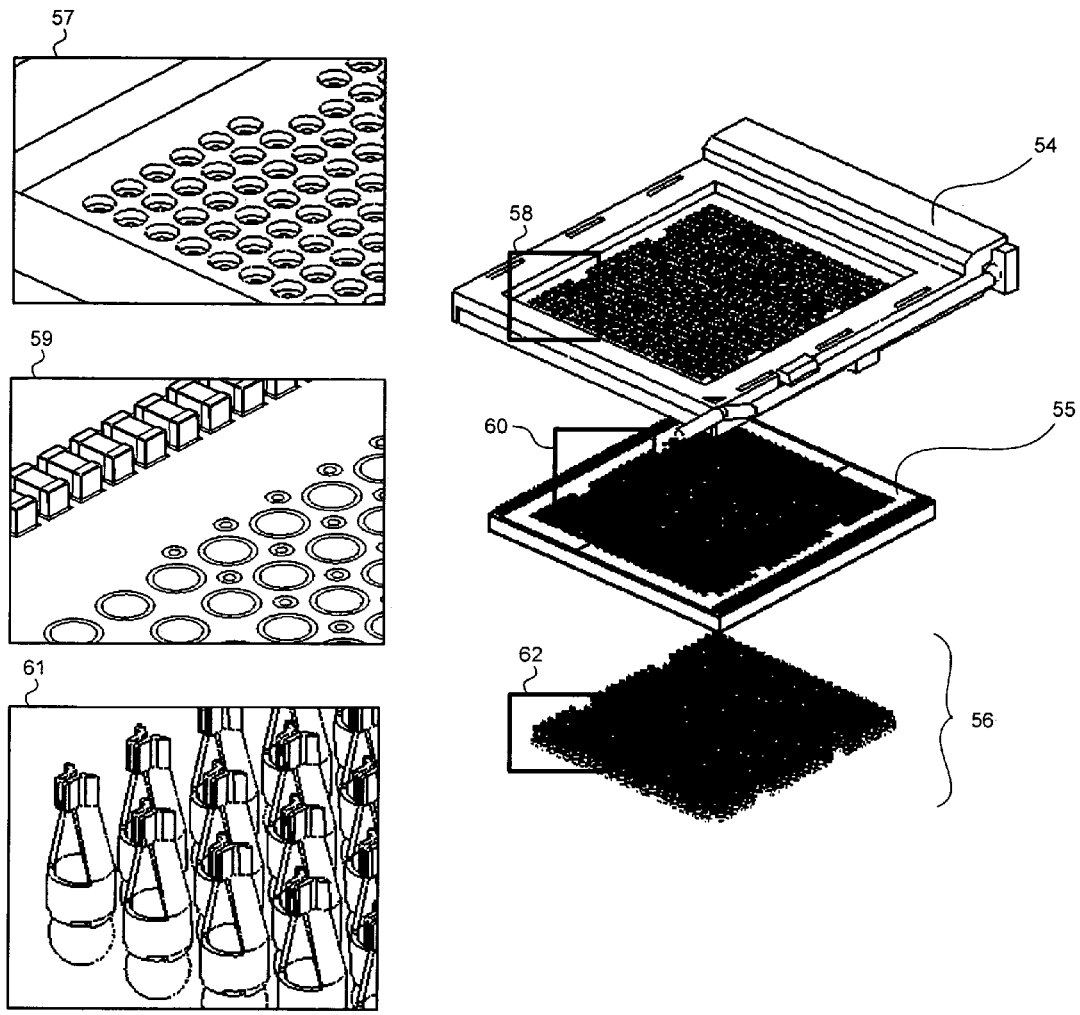
FIG. 10 is an exploded view of the ZIF PGA socket of FIG. 9.

FIG. 10 is an exploded view of the ZIF PGA socket 52. The socket includes an insulative housing portion 54, a printed circuit board (PCB) socket body portion 55, and an array of socket contacts 56. Box 57 is an expanded view of box 58 of insulative housing portion 54. Box 59 is an expanded view of box 60 of socket body portion 55. A two-dimensional array of larger diameter plated through holes is provided. Four smaller diameter plated through holes are disposed around each larger diameter through hole. A row of surface mount decoupling capacitors is soldered to the socket body portion. The plates of the decoupling capacitors are coupled to ground and power planes within socket body 55. Box 61 is an expanded view of box 62 of socket contact portion 56. The contact beam ends of these socket contact portions are shaped to receive pins from the side.

Figure 11:
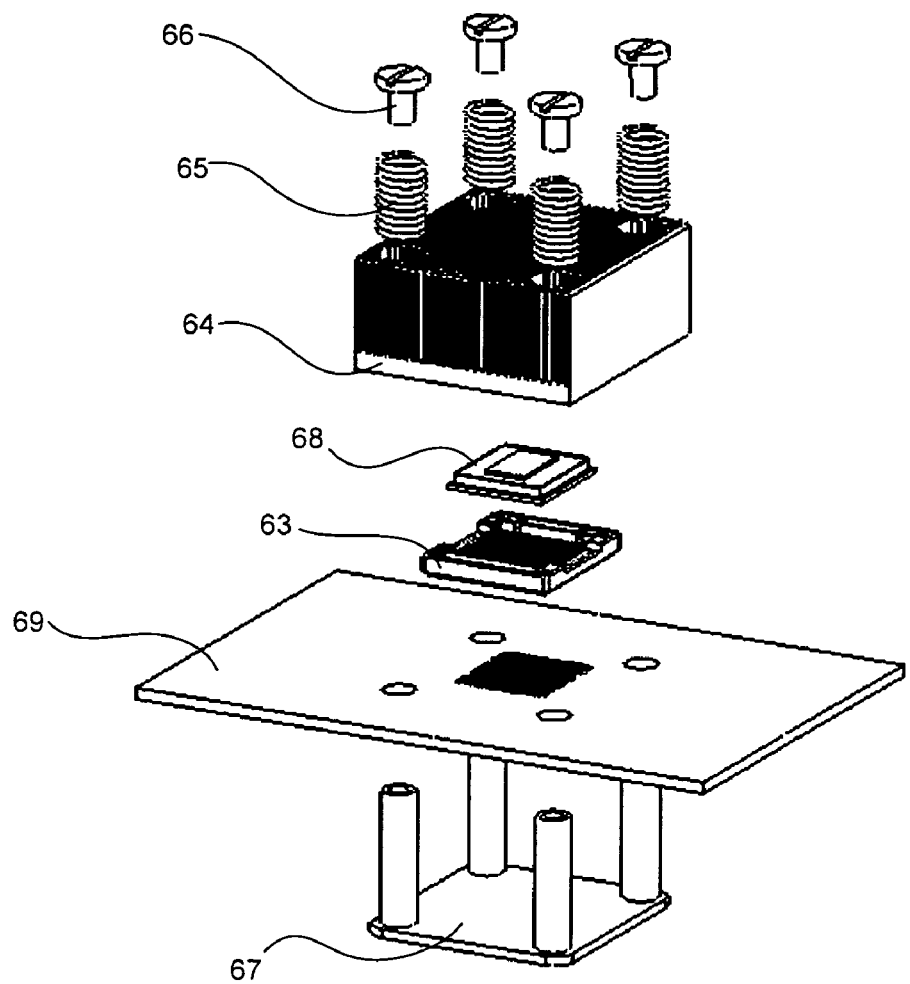
FIG. 11 is an exploded perspective view of an LGA (land grid array) socket with LGA compression hardware in accordance with a third novel aspect.

FIG. 11 is an exploded perspective view of a LGA (land grid array) socket 63 with LGA compression hardware in accordance with a third novel aspect. The hardware includes a heatsink 64, springs 65, screws 66, and a bolster plate 67 having threaded columns. Socket 63 is soldered to printed circuit board 69. IC package 68 has lands rather than pins. IC package 68 is placed in socket 63, the threaded columns of the bolster plate are inserted through holes in the printed circuit board 69, the heat sink 64 is placed on top, the springs 65 are inserted into accommodating holes in the heat sink 64, and screws 66 and screwed down through the springs and heatsink to engage threads in the columns of the bolster plate 67.

Figure 12:
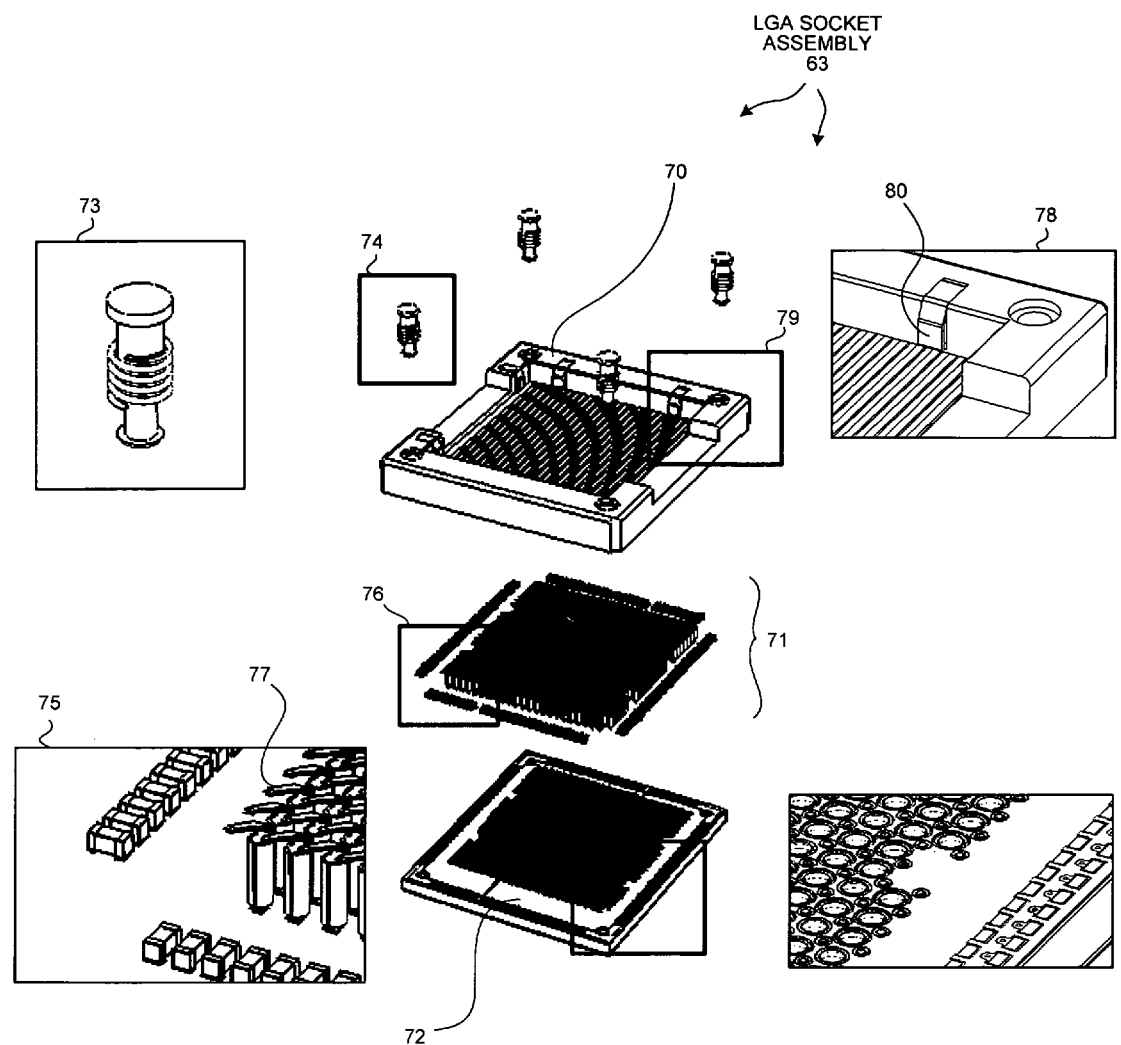
FIG. 12 is an exploded view of the LGA socket of FIG. 11.

FIG. 12 is an exploded view of the LGA socket 63 of FIG. 11. Socket 63 includes an insulative housing portion 70, an array of LGA contacts and capacitors 71, and a printed circuit board socket body portion 72. The LGA contacts 71 are inserted from the top into larger diameter plated through holes in the socket body portion 72. Box 73 is an expanded view of the guide pin and spring assembly of box 74. There are four such guide pins and spring assemblies, one located at each corner of insulative housing 70. The guide pin extends down and is press into an accommodating hole in printed circuit board socket body portion 72. The springs allow the insulative housing portion 70 to move up and down with respect to the printed circuit board socket body portion 72. Box 75 is an expanded view of box 76. Rather than having pairs of contact beams, each LGA contact includes a contact spring 77. When the IC package 68 is placed down on the socket, the contact springs 77 compress to make good electrical contact to contact pads on LGA package 68. Box 78 is an expanded view of box 79. A pusher 80 made of spring metal is provided in the cavity of insulative housing 70 to push IC package 68 to align it in position with respect to the LGA contacts.

Figure 13:
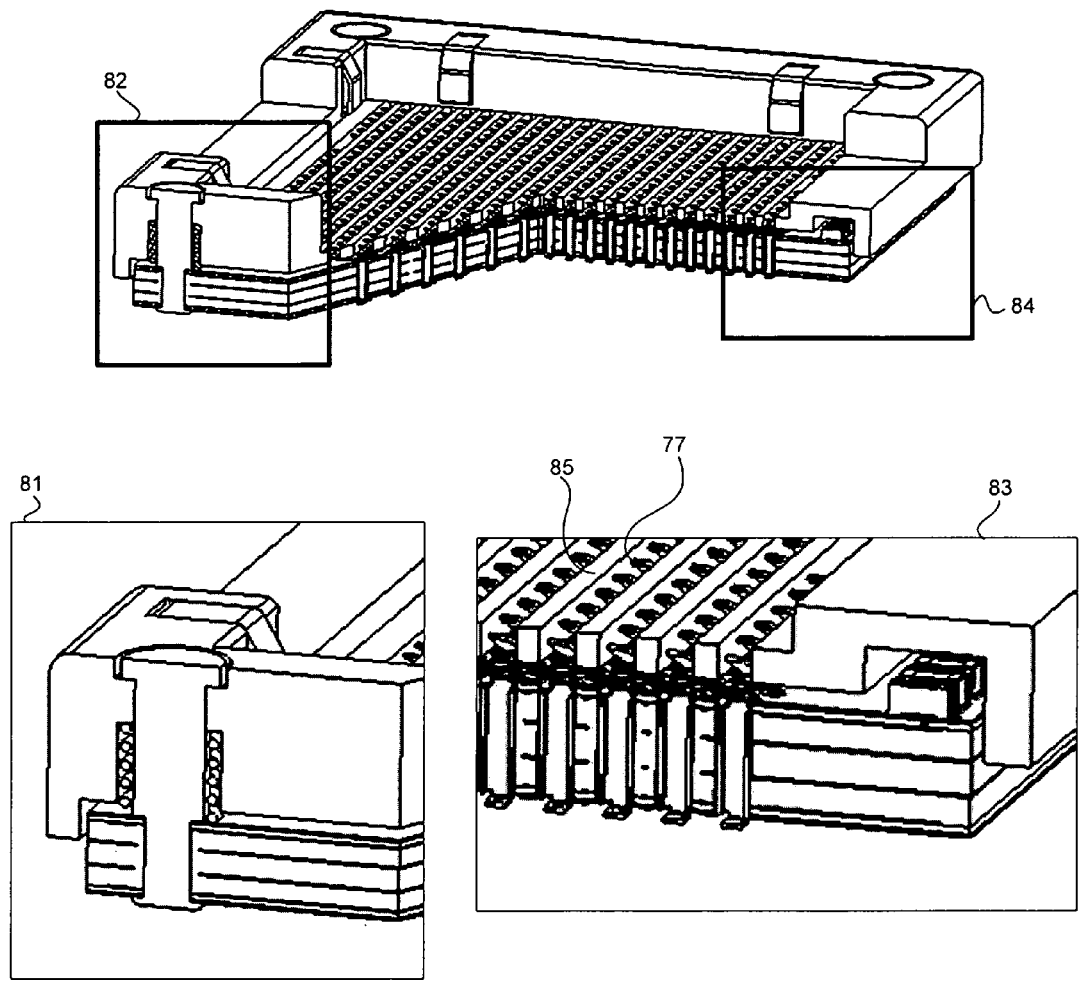
FIG. 13 is a sectional perspective view of the LGA socket of FIG. 11.

FIG. 13 is a sectional perspective view of LGA socket 63 of FIG. 11. Box 81 is an expanded view of box 82. Box 83 is an expanded view of box 84. A protective grill-shaped insulative structure 85 separates adjacent columns of LGA contacts 77. When the IC package is initially placed on the socket, the insulative housing 70 is separated from socket body portion 72 by the four springs of the guide pin and spring assemblies. At this point, the grill structure 85 prevents the bottom of the IC package from touching any of the contact springs 77. The IC package is then pressed down, depressing the springs, and thereby pressing down the insulative housing portion 70. The only motion of the IC package is straight down with respect to the socket body 72. As the IC package is pressed down farther, the pads on the bottom of the IC package make contact with the LGA contacts. The grill structure 85 helps prevent the fragile contact springs of the LGA contacts from being damaged.

Figure 14:
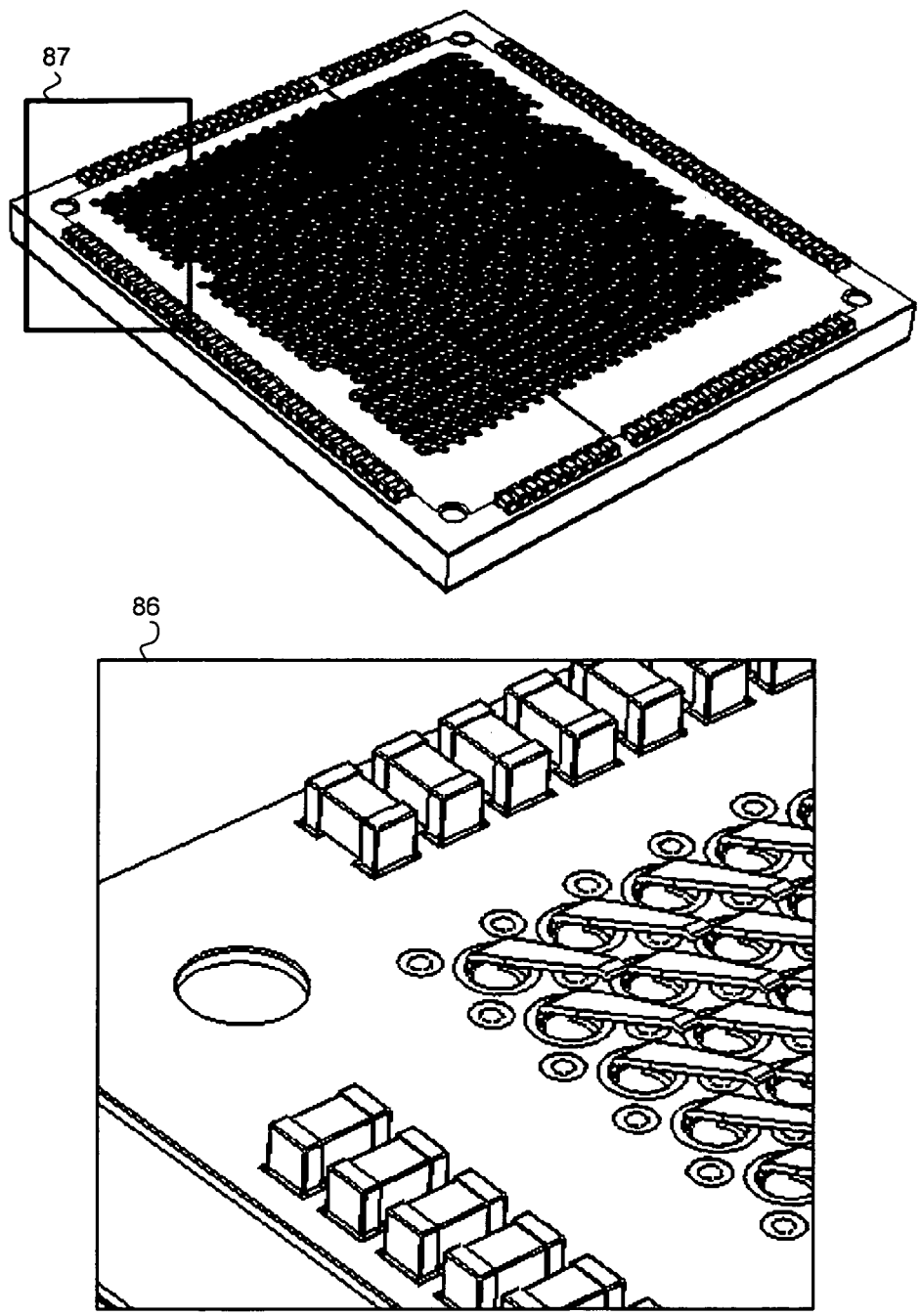
FIG. 14 is a perspective view of an assembly of the PCB socket body portion and LGA contacts and capacitors.

FIG. 14 is a perspective view of an assembly of PCB socket body portion 72 and LGA contacts and capacitors 71. Box 86 is an expanded view of box 87. Each larger diameter plated through hole is surrounded by four grounded smaller diameter plated through holes.

Figure 15:
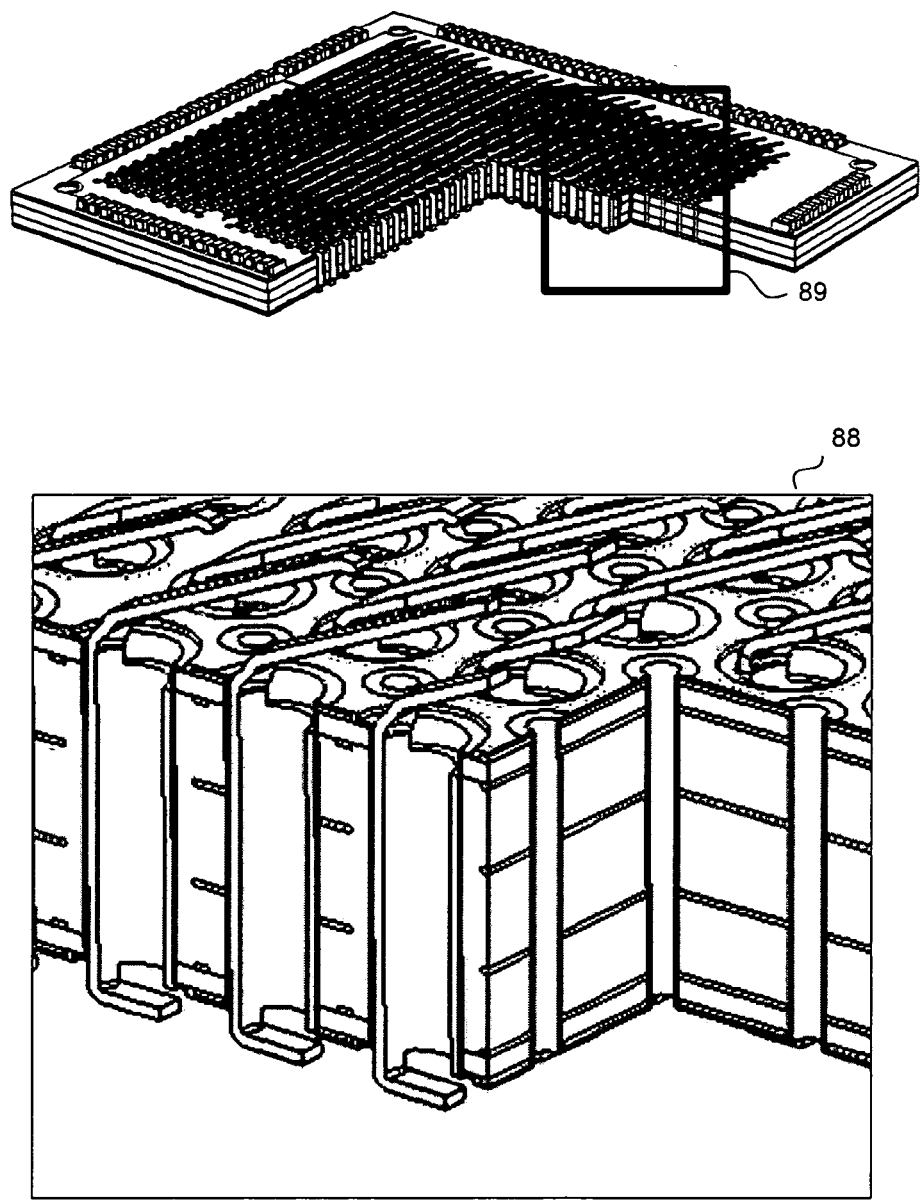
FIG. 15 is a cross-sectional diagram that shows the signal integrity portion of the LGA socket body assembly.

FIG. 15 is a cross-sectional diagram that shows the signal integrity portion of the LGA socket body assembly. Box 88 is an expanded view of box 89.

Figure 16:
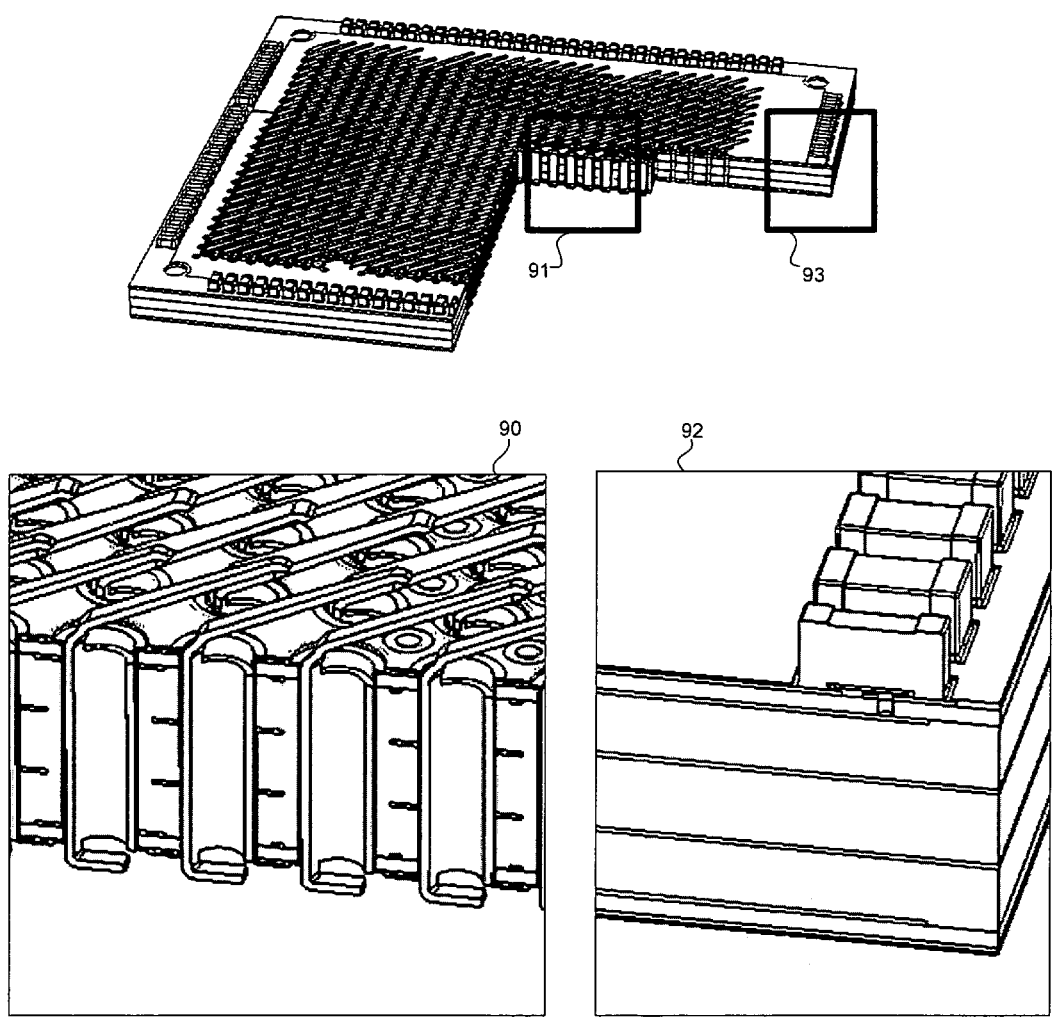
FIG. 16 is a cross-sectional diagram that shows the power integrity portion of the LGA socket body assembly.

FIG. 16 is a cross-sectional diagram that shows the power integrity portion of the LGA socket body assembly. Box 90 is an expanded view of box 91, and box 92 is an expanded view of box 93.

Figure 17:
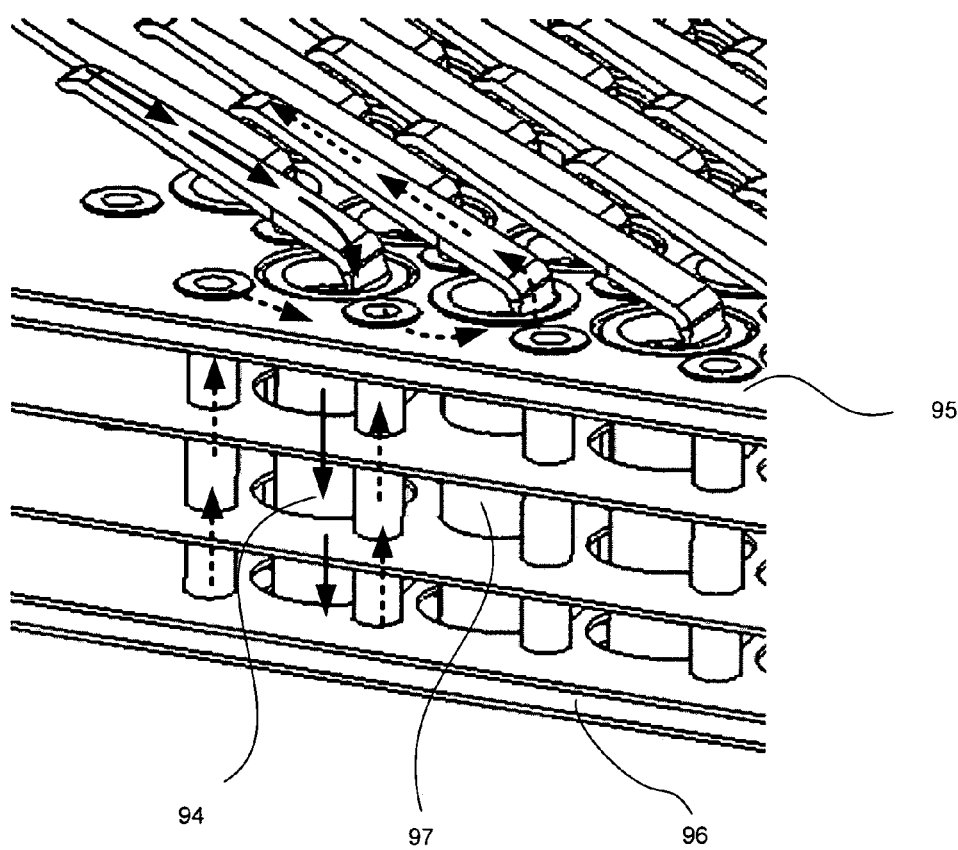
FIG. 17 is an expanded view of the LGA socket body assembly of FIG. 11.

FIG. 17 is an expanded view of the LGA socket body assembly. The dielectric material of the socket body portion is not shown so that the plated through holes can be seen. All of smaller diameter grounded plated through holes 94 are connected within the PCB socket body to: 1) a first ground plane 95 on the top of the printed circuit board socket body portion, 2) a second ground plane 96 on the bottom of the printed circuit board socket body portion, and 3) certain larger diameter plated through holes 97 (predetermined large diameter through holes that are used to connect to a ground pad on the IC package).

Figure 18:
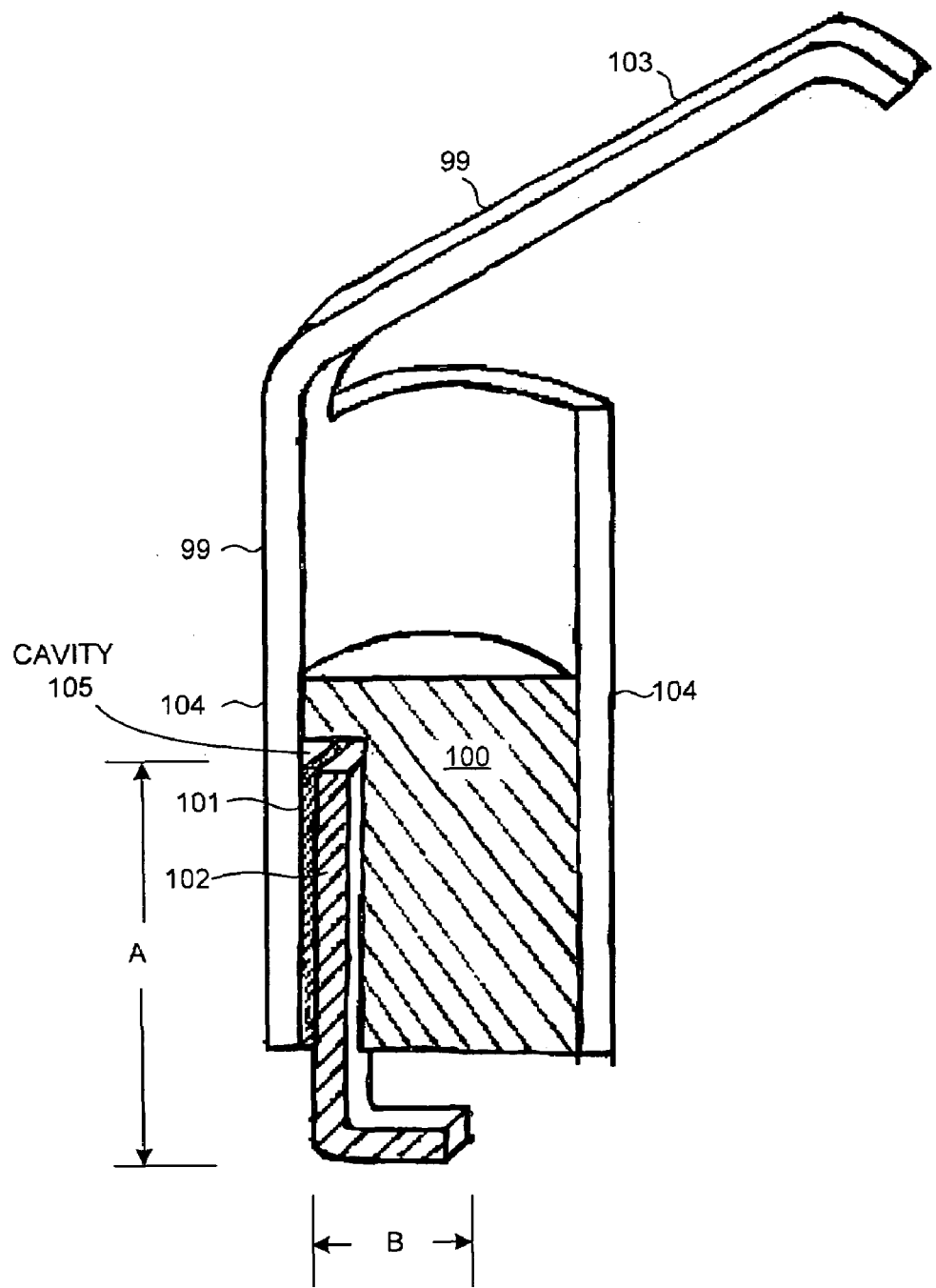
FIG. 18 is a cross-sectional perspective view of an LGA contact and self-adjusting solder tail assembly in accordance with a fourth aspect.

FIG. 18 is a cross-sectional perspective view of an LGA contact and self-adjusting solder tail assembly 98 in accordance with a fourth aspect. Assembly 98 is one of many such assemblies that are disposed in receiving holes in a PCB socket body portion of an LGA socket. The LGA socket can have a form as illustrated in FIG. 11, except that the contacts are not as shown in FIGS. 13, 15 and 16 but rather are as illustrated in FIG. 18. The PCB socket body portion is a printed circuit board made of FR4 or other printed circuit board material and includes the layers of FIG. 5 and the matrix of grounded plated through holes (for example, see plated through holes 24-27 of FIG. 4B).

Self-adjusting solder tail assembly 98 includes a contact 99, an insulative plug 100, a layer of solder 101, and a surface-mount attachment structure called a solder tail 102. Solder tail 102 is approximately 1.8 millimeters in dimension A, and 0.6 millimeters in dimension B. Contact 99 includes a contact spring portion 103 and a cylindrical body portion 104. The contact is stamped from sheet metal. In one embodiment, all the contacts in the PCB socket body portion are of identical construction. To assemble the PCB socket body portion, the contact is formed to have the cylindrical body portion, but the contact spring portion is not yet bent. The solder tail is soldered to the inside of the cylindrical body portion. The plug is then inserted to be in the position illustrated in FIG. 18. The resulting self-adjusting solder tail assembly 98 is then inserted into the receiving hole in the PCB socket body portion. The contact spring portion 103 is then bent to have the form illustrated in FIG. 18.

Figure 19:
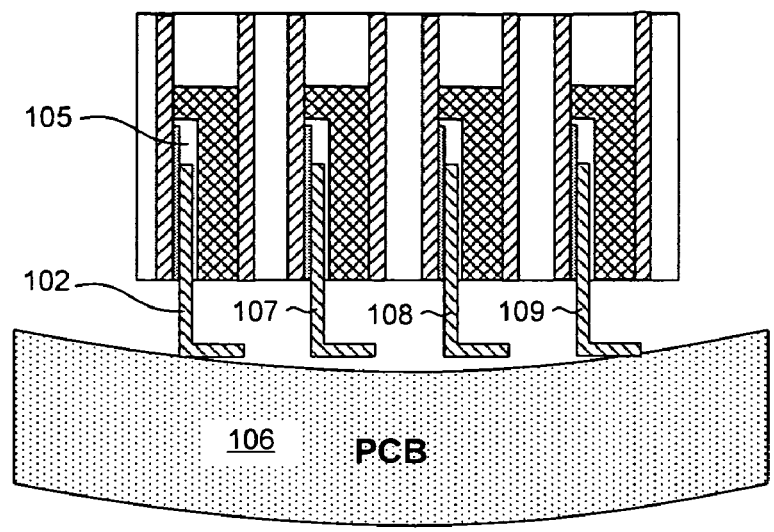
FIGS. 19 and 20 illustrate an operation of the self-adjusting solder tail assemblies in the novel LGA socket of the fourth aspect.
Figure 20:
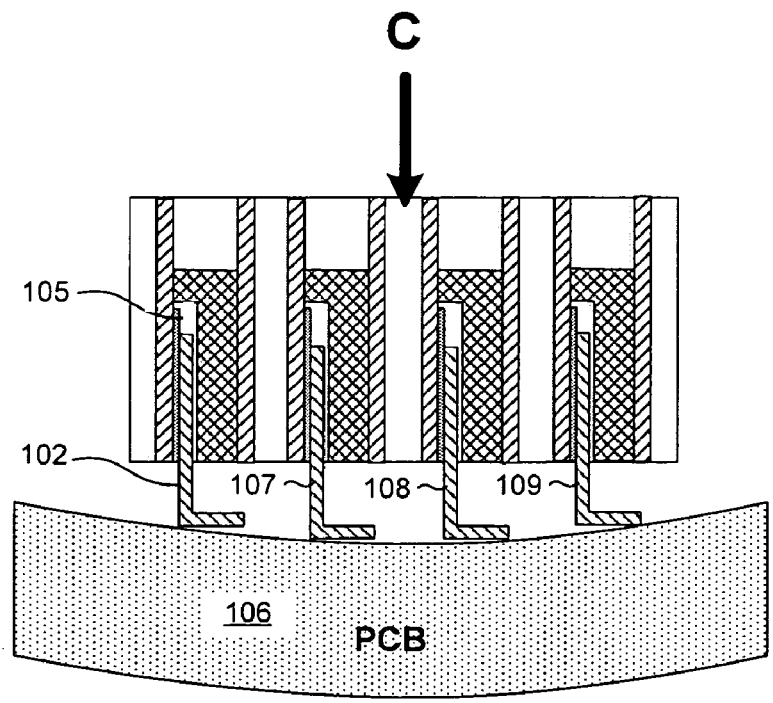

FIGS. 19 and 20 illustrate an operation of the self-adjusting solder tail assemblies in the novel LGA socket of the fourth aspect. In a first step, solder paste is applied to the upper surface of a printed circuit board 106 to which the LGA socket is to be soldered. (The insulative housing portion of the LGA socket is not illustrated in FIG. 19 and only a narrow slice section involving four self-adjusting solder tail assemblies is illustrated.)

In a second step, the LGA socket is placed on printed circuit board 106 so that the bottoms of the solder tails make contact with the solder paste on the top of the PCB 106. The structure to be assembled is as illustrated in FIG. 11 where LGA socket 63 is soldered to the upper surface of printed circuit board 69. The upper surface of the printed circuit board may be non-planar due to printed circuit board warpage. Where the LGA socket is large (such as where the LGA socket has one thousand or more contacts and the LGA socket is two inches or more square), some of the solder tails may not be touching solder paste on the printed circuit board due to PCB warpage as illustrated in the exaggerated view of FIG. 19.

In a third step, the structure of FIG. 19 is put through a reflow oven such that substantially all the solder holding the solder tail in the structure melts. Solder 101 melts, thereby freeing solder tail 102 to move vertically within a slide-guide cavity 105. Slide-guide cavity 105 is a slit-shaped elongated volume formed between plug 100 and the cylindrical body portion 104. The weight of the LGA socket (including insulative housing portion, the PCB socket body portion, and the contacts and capacitors) or another suitable force moves the LGA socket toward the PCB in direction C. The solder tails 102 and 109 that initially contact the PCB 106 are forced further into their respective cavities such that other solder tails 107 and 108 that previously did not contact PCB 106 now contact the PCB. The bottoms of all the solder tails 102, 107, 108 and 109 make contact with the PCB as illustrated in the simplified and exaggerated view of FIG. 20. When the solder is in molten form, the solder tails are held in place in their respective cavities. At the end of the reflow soldering process, the socket and PCB structure cools such that the solder tails on the socket are soldered to the PCB.

Although certain novel aspects have been described in connection with certain specific embodiments for instructional purposes, the novel aspects are not limited thereto. For example, the self-adjusting solder tail assembly is illustrated here in use in an LGA socket, but it also sees use in connector structures including a back plane connector that is surface mounted to a PCB (for example a high speed right angle back plane connector or a high speed mezzanine connector). Although the self-adjusting solder tail assembly is illustrated here having a contact spring, the self-adjusting solder tail assembly may include a pair of contact beams for receiving a pin of a pin grid array (PGA) integrated circuit package. Accordingly, various modifications, adaptations, and combinations of various features of the described embodiments can be practiced without departing from the scope of the invention as set forth in the claims.

What is claimed is:

1. A socket for holding an integrated circuit package, the socket comprising:
    an insulative housing, wherein a two-dimensional array of guide holes extends through the insulative housing; and
    a printed circuit board socket body portion (PCB socket body portion) in contact with the insulative housing, the PCB socket body portion comprising:
    a first printed circuit board that has a ground plane; and
    a plurality of surface mount contacts, each of the surface mount contacts having a first portion for contacting the integrated circuit package and a second portion for surfacing mounting to a second printed circuit board.

2. The socket of claim 1, wherein the first printed circuit board has a first planar surface and a second planar surface, the first printed circuit board including a plurality of AC grounded conductive columns (ACGCC), wherein each ACGCC extends through the first printed circuit board from a location proximate to the first planar surface to a location proximate to the second planar surface, wherein all the ACGCCs are electrically connected together and are electrically connected to the ground plane.

3. The socket of claim 2, wherein the first printed circuit board further comprises a plurality of signal conductors, and wherein the first printed circuit board includes at least as many ACGCCs as signal conductors.

4. The socket of claim 1, wherein the socket is a non zero insertion force pin grid array (PGA) socket.

5. The socket of claim 4, wherein the first portion of each of the surface mount contacts includes a cylindrically-shaped conductive portion and a pair of contact beams, wherein the second portion of each of the surface mount contacts is a solder ball, and wherein the solder ball is soldered to the cylindrically-shaped conductive portion.

6. The socket of claim 3, wherein each of the plurality of signal conductors is a larger diameter plated through hole, and wherein each of the plurality of ACGCCs is a smaller diameter plated through hole.

7. The socket of claim 6, wherein four ACGCCs are disposed around each signal conductor.

8. The socket of claim 3, wherein the first printed circuit board further comprises a power plane and a power conductor, and wherein the power conductor is coupled to the power plane.

9. The socket of claim 8, further comprising:
    a plurality of surface mount capacitors, wherein the capacitors are soldered to the ground plane and the power plane.

10. The socket of claim 9, wherein the insulative housing includes a vertically-oriented hole to allow heat from the capacitors to escape upward.

11. A socket for holding an integrated circuit package, the socket comprising:
    an insulative housing, wherein a two-dimensional array of guide holes extends through the insulative housing;
    a plurality of cylindrically-shaped signal conductors disposed in a printed circuit board, wherein the printed circuit board is in contact with the insulative housing; and means for preventing an aggressor signal in one of the signal conductors from inducing a cross-talk current in another signal conductor.

12. The socket of claim 11, wherein each of the plurality of signal conductors is a larger diameter plated through hole, and wherein the means comprises a plurality of smaller diameter plated through holes.

13. The socket of claim 12, wherein the printed circuit board includes at least as many smaller diameter plated through holes as signal conductors.

14. The socket of claim 12, wherein the means further comprises a ground conductor of the larger diameter.

15. The socket of claim 12, wherein the means further comprises a plurality of ground planes, wherein each of the plurality of ground planes is connected to the smaller diameter plated through holes.

16. A method comprising:
using a printed circuit board in a surface mount integrated circuit socket to conduct signals from a surface mount attachment structure of the socket to an integrated circuit held in the socket, wherein the socket includes an insulative housing in contact with the printed circuit board, and wherein a two-dimensional array of guide holes extends through the insulative housing.

17. The method of claim 16, further comprising:
grounding a plurality of plated through holes of a smaller diameter, wherein the printed circuit board includes a plurality of signal conductors of a larger diameter and the plurality of plated through holes of the smaller diameter.

18. The method of claim 17, wherein the printed circuit board includes a plurality of ground planes, wherein each ground plane is coupled to each of the plurality of plated through holes of the smaller diameter.

19. The socket of claim 2, wherein each of the surface mount contacts is disposed between the first planar surface and the second planar surface.

20. The socket of claim 6, wherein each of the guide holes is smaller than each of the larger diameter plated through holes.

* * * * *